Aug. 1, 1972 G. CHIZINSKY 3,681,220

METHOD OF MAKING A FIELD EFFECT TRANSISTOR

Filed April 3, 1969

INVENTOR.
GEORGE CHIZINSKY
BY
Kenway, Jenney + Hildreth
ATTORNEYS

United States Patent Office 3,681,220
Patented Aug. 1, 1972

3,681,220

METHOD OF MAKING A FIELD EFFECT TRANSISTOR

George Chizinsky Beverly Farms, Mass., assignor to KEV Electronics Corporation, Wilmington, Mass.

Filed Apr. 3, 1969, Ser. No. 813,148
Int. Cl. B01k *1/00*
U.S. Cl. 204—164 5 Claims

ABSTRACT OF THE DISCLOSURE

In the method described herein, the gate and channel of a field-effect transistor are created in separated portions of a layer of high resistivity semiconductor material by ion implantation using high energy ion beams. The use of such an implantation technique permits the implanted regions to be very sharply defined so that the gate and channel regions are separated by a high resistivity barrier which is of substantially uniform thickness.

BACKGROUND OF THE INVENTION

This invention relates to field-effect transistors and more particularly to such transistors fabricated by means of ion implantation.

While it has previously been proposed to fabricate transistors by ion implantation, such proposals have typically contemplated that a semiconductor material of one conductivity type would be locally implanted to convert its conductivity from the one type to the complementary type and thereby create a junction.

Similarly, while field-effect transistors have been fabricated heretofore by diffusion and epitaxial growth techniques, it has not heretofore been practical to fabricate a vertical channel field-effect transistor in which the gate and the channel are separated by a sharply defined high resistivity barrier of substantially uniform thickness, and in which the impurity concentration in the channel is relatively uniform in a plane normal to the channel. A transistor having such a construction is desirable in that the barrier improves the gate to drain breakdown voltage and reduces the gate to channel capacitance which improves frequency response. Further, constant impurity distribution in the channel enables such a transistor to function as a square-law device, that is, the current through the channel will vary substantially in proportion to the square of a bias voltage applied to the gate. Such square-law devices are highly useful in electronic circuits such as mixers, multipliers etc.

By the phrase vertical channel is meant a channel in which current flow through the channel is in a direction which is substantially normal to the plane of the substrate, that is, the plane of the surface, through which doping is applied. As is understood by those skilled in the art, semiconductor devices of the type under consideration can be operated in any physical orientation. Thus the term vertical as used herein should be understood to have only the meaning described above and should not imply any absolute physical orientation with respect to the earth or other frame of reference.

Among the several objects of the present invention may be noted the provision of a vertical channel field-effect transistor in which the gate and channel are separated by a high resistivity barrier of substantially uniform thickness; the provision of such a transistor which provides a substantially square-law operating characteristic; the provision of such a transistor which may be manufactured to have consistent and reproducible electrical characteristics; the provision of such a transistor which may be relatively simply and inexpensively manufactured; and the provision of such a transistor which is highly reliable.

Other objects and features will be in part apparent and in part pointed out hereinafter.

SUMMARY OF THE INVENTION

Briefly, in the practice of the method of the present invention, a field-effect transistor is fabricated by directing a beam of ions of a first type onto a first selected area of a layer of a high resistivity semiconductor material thereby to convert a first sharply-defined region of the layer to material which is of a first conductivity type and which has a relatively low resistivity. A beam of ions of a second type is directed onto at least a second area of the material thereby to convert a second sharply-defined region of the layer to material which is of a second conductivity type, complementary to the first conductivity type, and which has a relatively low resistivity. The separation between the first and second areas is relatively uniform over a substantial distance so that the first and second regions are separated by a barrier of high resistivity material of substantially uniform thickness. Accordingly, conduction through the first region in a direction substantially normal to the layer is controllable as a function of a voltage applied to the second region.

BRIEF DESCRIPTION OF THE DRAWINGS

Corresponding reference characters indicate corresponding parts throughout the several views of the drawings.

DESCRIPTION OF THE PREFERRED EMBODIMENT

Figure 1:
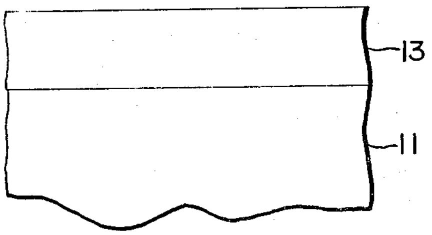
FIG. 1 is a sectional view of a substrate of low-resistivity semiconductor material upon which has been grown a layer of semiconductor material of high resistivity.

Referring now to FIG. 1, there is indicated at 11 a substrate of a semiconductor material, e.g. silicon, which has been relatively doped so as to have N-type conductivity and relatively low resistivity. On the top surface of substrate 11 is a semiconductor layer 13 which is nominally of P-type conductivity but which has a relatively high resistivity. Such a layer may be grown by conventional epitaxial techniques.

Figure 2:
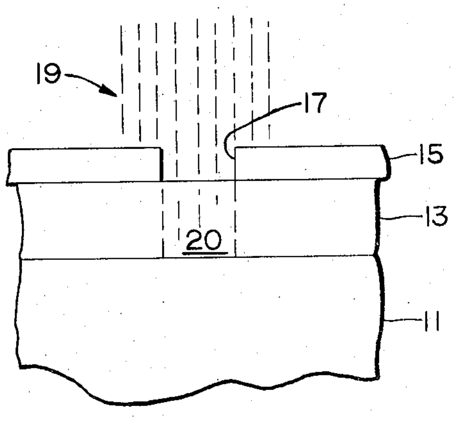
FIG. 2 is a sectional view illustrating the implanting of ions of a first type in a first region of the high resistivity layer.

A vertical channel, that is, a channel which is substantially perpendicular to the plane of layer 13, is created as illustrated in FIG. 2. The layer 13 is selectively masked by a layer 15 which is formed of a material suitable for blocking ion beams of the type described hereinafter. The masking layer is selectively etched away as indicated at 17, e.g. by photo-etching techniques known in the art, to leave a selected portion of the layer 13 exposed. The exposed portion of the layer 13 is then subjected to a beam of ions as indicated at 19, the beam impinging substantially normally as illustrated. The ions in the beam 19 are of a type, e.g. phosphorous, which will produce N-type conductivity in the material of layer 13 by providing free electrons in the crystal lattice. Thus, the portion of the layer 13 which is exposed through the masking layer 15 is converted to N-type conductivity. This portion of layer 13 is designated as region 20. Preferably, the masking layer is etched away in such a manner as to provide a relatively square sided opening 16 so that the region 20 is relatively sharply defined, that is, so that there is no gradual variation of impurity distribution due to ions penetrating the mask near the edge of the aperture 17.

Methods of providing ion beams are known in the art and are therefore not described in detail herein. However, it may be noted that the beam 19 is preferably scanned in a raster across the layer 13 so as to provide a uniform ion flux over the exposed surface. Preferably also, the energies of the impinging ions are varied over a range such that the region 20 is relatively uniformly implanted throughout its entire depth, even though some ions reach the substrate 11. As is understood, the depth of implantation is statistically dependent on the energy of the ions. Thus the desired impurity distribution profile as a function of depth can be achieved by summing the profiles obtained at different ion energy levels.

Figure 3:
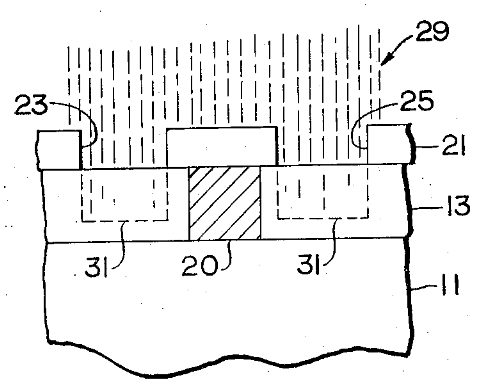
FIG. 3 is a sectional view illustrating the implanting of ions of a second type in selected regions of the layer.
Figure 5:
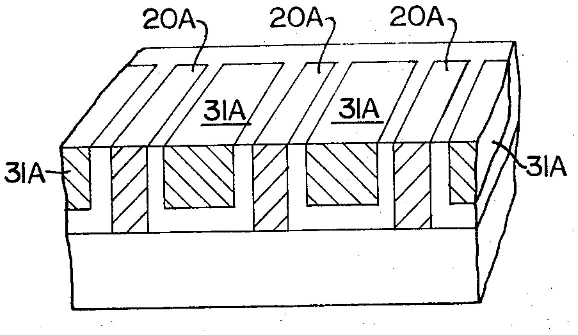
FIGS. 5 and 6 illustrate different configurations of transistors fabricated according to the method of the present invention.

After the layer 13 has been exposed by the beam 19 to create the N-type channel region 20, the masking layer 15 is removed and a second masking layer 21 is laid down over the layer 13 as shown in FIG. 3. This layer is selectively etched away, as indicated at 23 and 25, to expose portions of the layer 13 which are on either side of the channel region 20. In practice, the masks 15 and 21 are preferably etched in a repeated pattern so as to provide a plurality of transistor units on a single substrate, such multiple unit configurations being illustrated in FIGS. 5 and 6, described hereinafter.

A beam of ions 29 is then directed onto the exposed areas of layer 13, the beam again being scanned to provide a uniform ion flux over the exposed area. The energy of beam 29 is varied over a range to implant ions over a portion of the depth of the layer 13 as indicated in FIG. 3. The ions comprising beam 29 are of a type, e.g. boron, which will produce P-type conductivity in the material of layer 13. Thus, the regions, designated 31, which are exposed to the beam 29 are converted to material which has P-type conductivity and which has a low resistivity, relative to the starting material. As will be apparent hereinafter, the regions 31 function as a gate controlling conductivity through the channel region 20. Since the method of implanting ions illustrated, using an ion beam, produces sharply defined regions of changed or converted conductivity, there is a relatively abrupt, essentially vertical surface of demarcation between each of the implanted regions and the surrounding high resistivity starting material.

Figure 6:
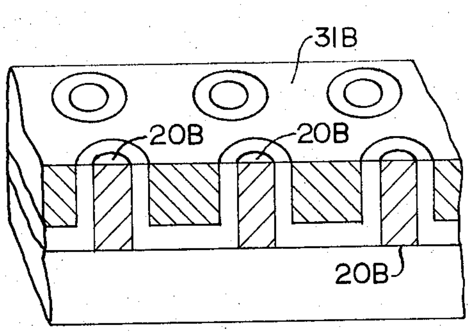

The masking layers 15 and 21 are preferably etched in patterns shaped so that the gate and channel regions are uniformly separated. In the embodiment illustrated in FIG. 5, the channel regions, designated 20A, and gate regions, designated 31A, extend linearly in a direction perpendicular to the plane of the drawings of FIGS. 1–3 for a substantial distance. In FIG. 6 a coaxial configuration is employed in which the channel regions, designated 20B, are essentially cylindrical and the gate region or regions, designated 31B, are interconnected and coaxially surround the channels.

Since the ion implantation process described above provides a relatively sharply defined vertical surface of demarcation between each of the regions of changed conductivity and the remaining high-resistivity starting material, it can be seen that the high resistivity material remaining between each channel region and the adjacent gate regions forms a barrier which is of substantially the same thickness at various depths.

Figure 4:
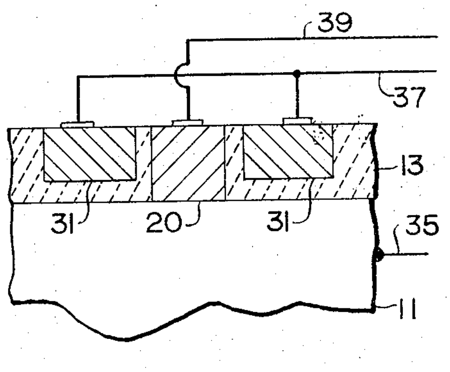
FIG. 4 is a sectional view of a completed transistor fabricated as illustrated in FIGS. 1–3.

After ion implantation is completed, the masking layer 21 is removed and the device is heat treated if necessary to heal bombardment damage to the lattice and to place implanted ions in substitutional positions. After appropriate metalization, a lead 35 is attached to the substrate 11, a lead 37 is connected to the gate regions 31, and a lead 39 is attached to the channel region 20, as illustrated in FIG. 4. If desired, a shallow layer at the top of the channel region 20 may be relatively heavily doped, as a part of the ion implantation process, to facilitate the contact. The leads may be attached by thermo-compression bonding, ultrasonic bonding or other suitable means known in the art. The device may then be passivated and encapsulated or packaged as desired.

In operation, the upper surface of the channel region 20 functions as the source and the substrate 11 functions as the drain. The gate regions 31 are then biased to control conduction through the channel region in the vertical direction by means of the so-called field effect. The device thus functions as an N-channel field-effect transistor. The relatively uniform, high resistivity barrier between the channel region and the adjacent gate regions provides very low inter-element capacitance. As will be understood by those skilled in the art, such characteristics are highly advantageous in a variety of circuits. Further, since the distribution of impurities in the channel is highly uniform up to the vertical surface of demarcation between it and the barrier, conduction through the channel in the vertical direction, that is, in a direction which is substantially normal to the layer 13, will be variable substantially in proportion to the square of the bias voltage applied to the gate regions. As is understood, such square-law devices are highly useful in a variety of devices such as mixers, converters, analog multipliers and the like. Further, the remaining high resistivity material provides advantageous breakdown characteristics.

As the characteristics of the completed device are determined essentially by the type of ions implanted for the channel and gate regions and by the geometry of the device, it can be seen that the same starting material, i.e. the substrate 11 together with the epitaxially grown layer 13, may be used for a variety of different devices. This ability to use one starting material for a variety of devices substantially reduces manufacturing costs. Further, since the ion implantation process can be quite precisely controlled over a substantial range of ion flux and energy values, devices having particular characteristics may be reproducibly manufactured and are reliable in operation. While an N-channel device has been described, it will be understood that the P-channel devices can also be fabricated by the method of this invention.

In view of the foregoing, it can be seen that the several objects of the invention are achieved and other advantageous results have been attained.

As various changes could be made in the above-described constructions without departing from the scope of the invention, it should be understood that all matter contained in the above description or shown in the accompanying drawings shall be interpreted as illustrative and not in a limiting sense.

What is claimed is:

1. The method of fabricating a field-effect transistor comprising:

epitaxially growing, on a substrate of semiconductor material having substantial conductivity of a first type, a layer of semiconductor material of resistivity which is substantially higher than that of said substrate;

directing a beam of ions of a first type onto a first selected area of said layer thereby to form a channel region which is of the same conductivity type as said substrate and which extends through said layer from its outer surface to said substrate; and directing a beam of ions of a second type onto at least a second area of said layer adjacent said first layer thereby to form a sharply-defined gate region extending partially through said layer, said gate region being of a conductivity type which is complementary to the conductivity type of said substrate, the separation between said first and second areas being uniform over a substantial circumferential distance around said first area whereby said first and second regions are separated by a barrier of the original high resistivity material, which barrier is of substantially uniform lateral thickness and whereby conduction through said channel region from said substrate to the outer surface of said channel region is controllable as a function of the voltage applied to said gate region.

2. The method as set forth in claim 1 in which the starting substrate and the layer epitaxially grown thereon are essentially silicon.

3. The method as set forth in claim 2 wherein said ions of a first type are phosphorous ions.

4. The method as set forth in claim 3 wherein said ions of a second type are boron ions.

5. The method as set forth in claim 4 wherein the material of said layer is nominally of P-type conductivity.

References Cited

UNITED STATES PATENTS

| | | | |
|---|---|---|---|
| 3,328,210 | 6/1967 | McCaldin et al. | 29—571 |
| 3,341,352 | 9/1967 | Ehlers | 204—164 |
| 3,401,107 | 9/1968 | Redington | 204—164 |
| 3,481,031 | 12/1969 | Klasens | 29—571 |
| 3,514,844 | 6/1970 | Bower et al. | 29—584 |

JOHN H. MACK, Primary Examiner

W. I. SOLOMON, Assistant Examiner

U.S. Cl. X.R.

29—571, 584; 148—1.5